United States Patent [19]
Cognetti et al.

[11] Patent Number: 5,629,574
[45] Date of Patent: May 13, 1997

[54] CONTROL INTERFACE DEVICE FOR AN ELECTRIC MOTOR

[75] Inventors: Carlo Cognetti; Giuseppe Marchisi, both of Milan, Italy

[73] Assignee: SGS-Thomson Microelectronics, S.r.l., Agrate Brianza, Italy

[21] Appl. No.: 86,170

[22] Filed: Jun. 30, 1993

[30] Foreign Application Priority Data

Jun. 30, 1992 [IT] Italy ........................ MI92A1587

[51] Int. Cl.$^6$ .................. H02K 11/00; H02K 1/04; H02K 15/00; H01L 23/28
[52] U.S. Cl. .................. 310/71; 310/43; 310/68 R; 310/42; 174/52.2
[58] Field of Search .................. 310/68 R, 43, 310/71, 42; 361/813; 29/827, 841; 257/667, 787; 437/209, 211; 264/272.17; 174/52.1, 52.2, 52.3, 52.4

[56] References Cited

U.S. PATENT DOCUMENTS

| | | | |
|---|---|---|---|
| 3,500,085 | 3/1970 | Smith | 310/68 R |
| 3,593,411 | 7/1971 | Dunn | 264/272.17 |
| 3,659,188 | 4/1972 | Alexander et al. | 310/71 |
| 4,012,723 | 3/1977 | Harper | 174/52 PE |
| 4,709,123 | 11/1987 | Yamashita et al. | 174/52 R |
| 4,957,876 | 9/1990 | Shibata et al. | 437/211 |
| 5,206,188 | 4/1993 | Hiroi et al. | 29/827 |
| 5,262,927 | 11/1993 | Chia et al. | 257/787 |

FOREIGN PATENT DOCUMENTS

| | | | |
|---|---|---|---|
| 98051 | 1/1984 | European Pat. Off. | 257/787 |
| 252481 | 7/1987 | European Pat. Off. | |
| 1220042 | 6/1966 | Germany . | |
| 1591584 | 10/1969 | Germany | 29/627 |
| 8527350 | 9/1985 | Germany . | |
| 3805060 | 2/1988 | Germany . | |
| 3803164 | 8/1989 | Germany | 310/71 |
| 4138818 | 6/1992 | Germany | 361/813 |
| 58-82549 | 5/1983 | Japan | 437/209 |
| 61-88535 | 5/1986 | Japan | 264/272.17 |
| 62-142338 | 6/1987 | Japan | 257/787 |
| 62-158352 | 7/1987 | Japan | 257/787 |
| 1-108755 | 4/1989 | Japan | 257/787 |
| 1-174249 | 7/1989 | Japan | 310/71 |
| 5-64410 | 3/1993 | Japan | 310/71 |

Primary Examiner—Clayton E. LaBalle
Attorney, Agent, or Firm—Robert Groover; Betty Formby

[57] ABSTRACT

A control interface device for an electric motor, particularly an electric motor for operating servomechanisms on a vehicle, which includes a conductor frame, an active integrated component mounted on the conductor frame, and a plurality of electric connectors. A single insulating, one-piece enclosing body contains the conductor frame with the active integrated component and the electric connectors included to the conductor frame. Thus, all of the elements required for powering and controlling the motor are gathered inside a single enclosing body which is convenient to handle and connect.

21 Claims, 2 Drawing Sheets

CONTROL INTERFACE DEVICE FOR AN ELECTRIC MOTOR

CROSS-REFERENCE TO RELATED APPLICATION

This application claims priority from Italian App'n MI92A001587, filed Jun. 30, 1992, which is hereby incorporated by reference.

BACKGROUND AND SUMMARY OF THE INVENTION

This invention relates to control devices for small motors, and to methods for manufacture and assembly thereof. The field of application of this invention is particularly, but not solely, related to an electric motor for operating such servomechanisms as may equip a vehicle, and reference to that field will be made in the following description for convenience of illustration.

Electric motors are utilized in ever increasing number on modern vehicles for operating a range of servomechanisms, such as power windows, power seats, heating/air-conditioning system controls, self-locking doors, aerial drives, etc. Such motors must be powered under control by some specific electric and electronic components of a passive type (resistors and capacitors) as well as an active type (an integrated circuit).

To this aim, a printed circuit is usually provided to carry the necessary passive and active components. The printed circuit is first mounted onto an insulating holder, and then connected electrically to the motor by fitting purposely provided female connectors thereof over projecting leads (electrically active studs) from the motor. The female connectors are simple through holes formed in the printed circuit board. The printed circuit board may be provided with deformable lugs for retaining the leads securely therein after their insertion. In addition, a multiple connector is normally attached to the printed circuit, so that connection can be made to power and control wiring. Accordingly, assembly of the motor tends to be an awkward operation.

The underlying problem of this invention is, therefore, to provide for simpler assembly of an electric motor for vehicular applications. This problem is solved, according to the invention, by a control interface device which includes an integrated circuit encapsulated in a single solid body, which has apertures (e.g. through holes) in it for mounting on the motor leads, and which also has a standard connector interface extending out from the body, for attachment of a standard wiring connector to provide power and signal connections. In this way, all of the required elements for powering and controlling the motor can be contained within a single enclosing body which is more convenient to handle and connect.

Thus, the electric connectors of the solid body preferably include male connectors for connection to power and control wires, and female connectors for connection to the motor. The enclosing body will preferably include alignment pins, formed integrally at locations proximate to the male connectors, which serve to ensure a correct and secure mechanical coupling to the power and control wires.

Preferably, the enclosing body is injection molded around the active component on a lead frame, and the waste portions of the lead frame are later sheared off.

According to one class of innovative embodiments, there is provided: a control interface device for an electronic motor, comprising: a plurality of leads formed of a common conductive material, and sharing a substantially common plane; an integrated circuit mounted on at least one of the leads, and electrically connected to others of the leads; an enclosing body of an electrically insulative material which surrounds the integrated circuit and at least a portion of each the lead; the body including through-holes therein which pass through the body, in a direction substantially normal to the plane, and which abut one of the leads therein; some ones of the leads extending out of the body to provide a plurality of parallel electromechanical connectors.

According to another class of innovative embodiments, there is provided: an electronic motor assembly, comprising: a housing which encloses a motor and which has an aperture therein with substantially rigid studs protruding through the aperture to provide electrical connection to the motor; and a plurality of leads formed of a common conductive material, and sharing a substantially common plane; an integrated circuit mounted on at least one of the leads, and electrically connected to others of the leads; an enclosing body of an electrically insulative material which surrounds the integrated circuit and at least a portion of each the lead; the body including apertures therein which provide openings into the body in a direction substantially normal to the plane, and which abut one of the leads therein; some ones of the leads extending out of the body to provide a plurality of parallel electromechanical connectors.

According to another class of innovative embodiments, there is provided: a method of assembling an electronic motor assembly, comprising the steps of: providing a housing which encloses a motor and which has an aperture therein with substantially rigid studs protruding through the aperture to provide electrical connection to the motor; inserting, onto the studs, a solid control module which includes at least one integrated circuit encapsulated therein, and which has apertures therein in a pattern which generally corresponds to the studs, and including concealed internal electrical connections to at least some of the apertures; the solid control module also having lateral connectors, which are normal to the studs; and inserting a connector, onto the lateral connectors of the solid encapsulated control module, to provide power, signal, and ground connections.

According to another class of innovative embodiments, there is provided: a fabrication method, comprising the steps of: forming a frame from a sheet of conductive material, the frame having electromechanical connectors integral with the body of the frame; mechanically securing an integrated circuit to the frame and establishing electrical links as needed; using an injection molding process to form an enclosing body of an electrically insulating material over the frame and the integrated circuit together, the enclosing body including through-holes therein which pass through the body, in a direction substantially normal to the frame, and which adjoin ones of the leads within the body; and removing waste portions of the frame, to define electrically separate leads which are connected to different respective portions of the integrated circuit.

Further features and advantages of a control interface device according to the invention will become more clearly apparent from the following description of a preferred embodiment thereof, to be read in conjunction with the accompanying drawings.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
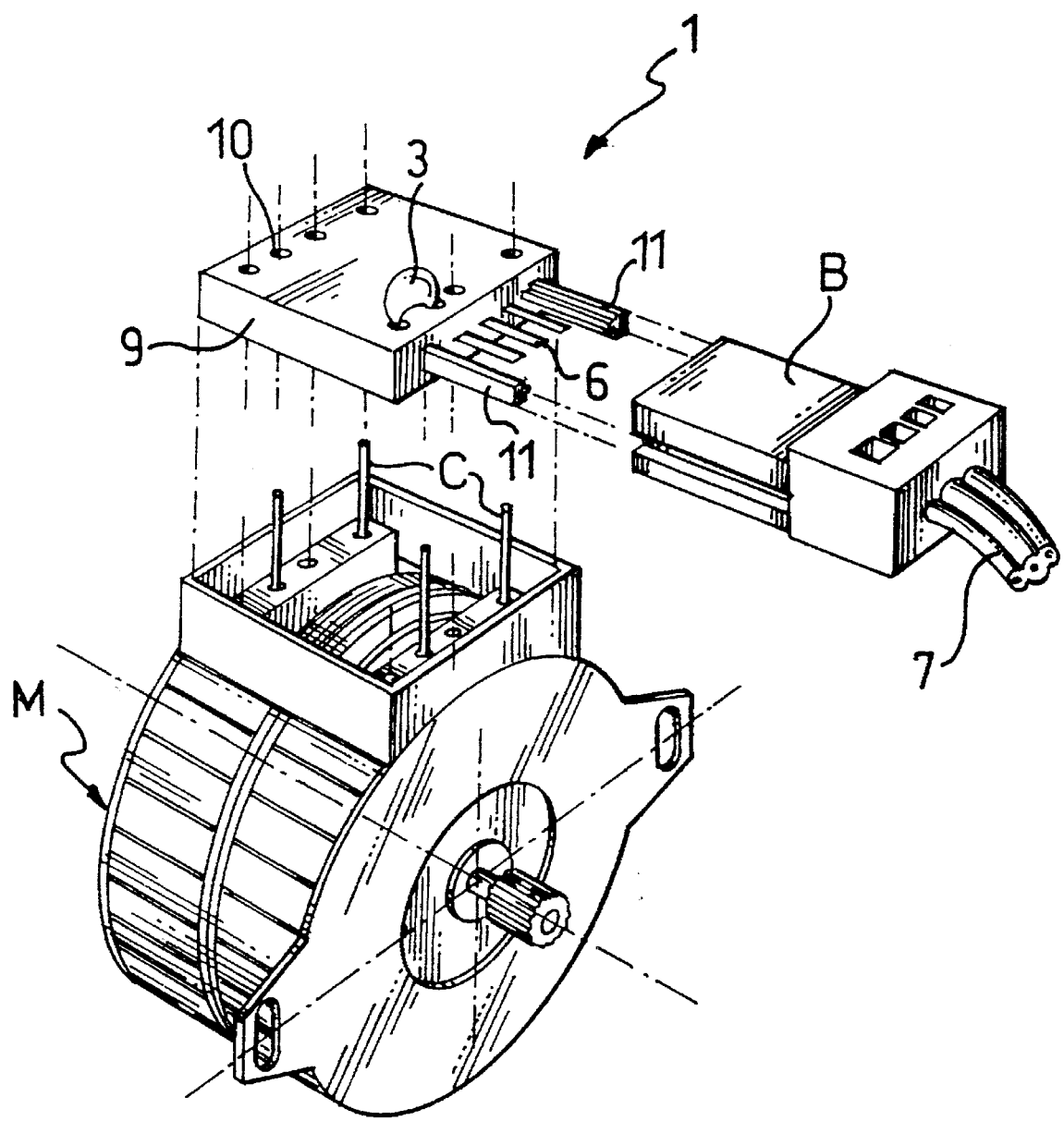
FIG. 1 is a perspective view showing schematically a device according to the invention as applied to an electric motor.
Figure 2:
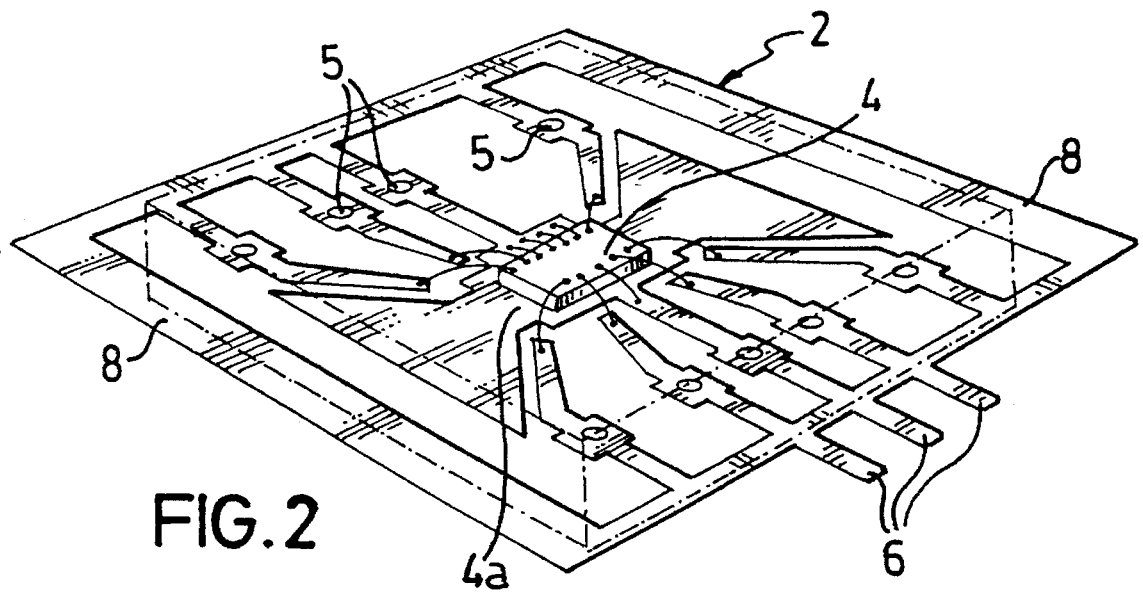
FIGS. 2 and 3 are perspective views illustrating schematically sequential steps in the process of making the device depicted in FIG. 1.
Figure 3:
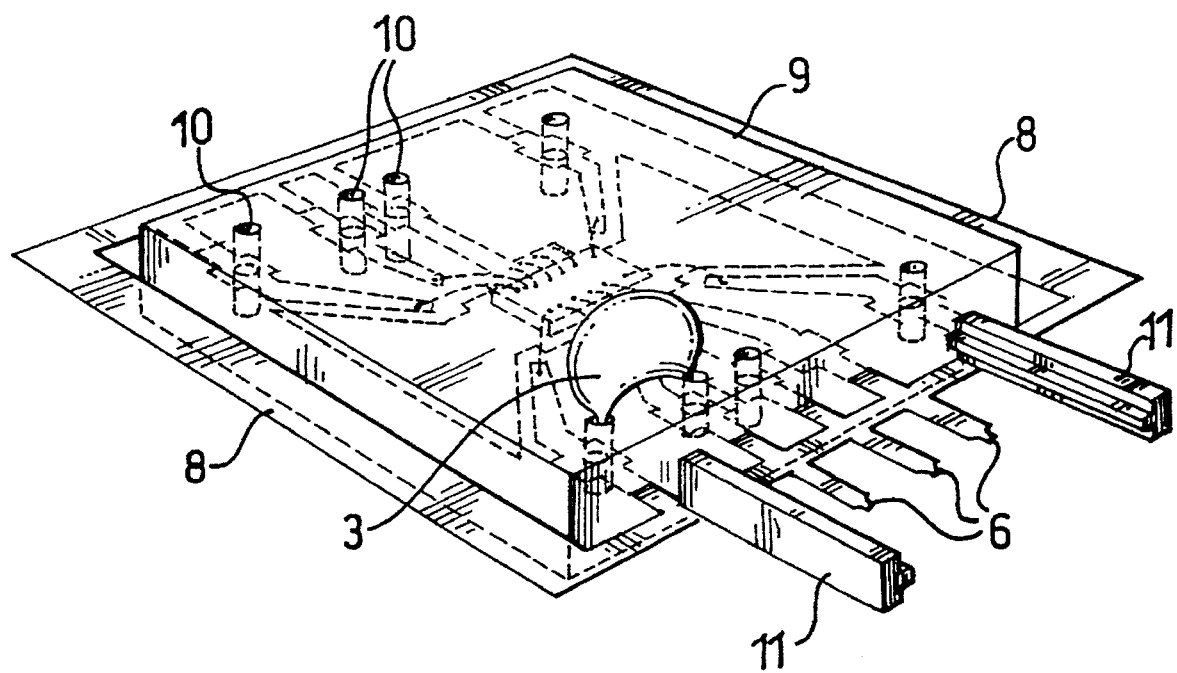

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Shown generally at 1 in the drawing figures is a control interface device for an electric motor M.

The device 1 comprises a conductor frame 2 on which passive electric components, such as a capacitor 3, and an active electric component or integrated circuit 4 are mounted; specifically, the integrated circuit 4 is mounted in a dedicated central area 4a of the conductor frame 2.

The conductor frame 2 includes not only points of connection for the above-mentioned electric components, but also connectors for connection to the outside world. In particular, the frame 2 includes female connectors 5 for connection to the motor M and the passive components, and male connectors 6 for connection to power and control wires 7. Initially, the conductor frame 2 also has waste portions 8 useful to hold together the various portions of the frame 2.

The conductor frame 2 with the integrated circuit 4 is contained within an enclosing body 9 which is a one-piece construction injection molded from an electrically insulating material, such as an epoxy resin.

The female connectors 5 can be reached via through holes 10 which penetrate the enclosing body 9.

The male connectors 6, in the presently preferred embodiment, project from the enclosing body 9, which is provided with alignment pins 11 formed integrally therewith at locations proximate to the male connectors 6.

The device 1 is manufactured as follows.

During a first step, the frame 2 is formed from a sheet of a conductive material; the frame 2 also includes the waste portions 8, as required to impart a degree of stiffness to the conductor frame 2.

During a second step, the integrated circuit 4 is secured in the area 4a of the conductor frame 2 and its electric links are established. The electric links are intended to interconnect the integrated circuit 4 and the connectors 5 and 6.

During a third step, the enclosing body 9 (complete with the alignment pins 11) is molded over the conductor frame 2 by an injection molding process from a suitable electrically insulating plastics material.

During a fourth step, the waste portions 8 of the conductor frame 2 are removed (since the enclosing body 9 now provides mechanical support).

Finally, the passive components, such as the capacitor 3, are secured and connected electrically by fitting the respective leads into the female connectors 5.

The interface device 1 is now ready to be installed on the motor M. This is simply done by inserting the leads C of motor M into the respective female connectors 5 on the device 1.

Connection to the power and control lines from the vehicle electric system is even simpler to carry out: the respective female connectors B of the lines are simply inserted onto the male connectors 6. The alignment pins 11 will foster correct insertion and provide for the necessary mechanical securement.

As may be appreciated, a device according to the invention can solve the technical problem proposed at the outset of this description, and provide for more straightforward assembling of electric motors to a vehicle.

It should be noted that the disclosed inventions afford a significant reduction in both assembly cost (on account of the simpler procedure provided thereby) and material costs. In fact, the device of this invention is less expensive than the whole of the conventional devices which it is designed to replace.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The disclosed innovations are particularly suitable for small DC stepper motors, such as may be used in automotive applications. The electrical connections into the motor, in a sample embodiment, are merely "on" and "off" connections. However, of course, other types of motors may require different inputs.

The rectangular opening at the top of the motor, into which the device 1 is vertically lowered, is a standard feature of many such motor housings. This rectangular opening is typically used for a printed circuit board. Of course, the specific form factor and stud locations shown are not necessary to practice of the invention. Similarly, the specific format of connector B is not necessary to practice of the invention, and other formats can be used instead.

Optionally, the through holes may be tapered on the lower sides, to provide easier alignment and insertion of the motor connectors C.

Of course, a variety of motor control or smart power chips can be used for the integrated circuit 4, and other discrete devices, besides capacitor 3, can optionally be mounted on top of the control device.

In the process flow described, no cover is provided to protect the control device 1 or motor leads C. However, of course, appropriate steps can be used later to provide electric and environmental isolation.

While the disclosed innovations have been particularly described in the context of 12V automotive applications, they can also be adapted to other applications.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A control interface device for an electronic motor, comprising:

a plurality of leads formed of a common conductive material, and sharing a substantially common plane;

an integrated circuit mounted on at least one of said leads, and electrically connected to others of said leads;

an enclosing body of an electrically insulative material which surrounds said integrated circuit and at least a portion of each said lead;

said body including through-holes therein which pass through said body, in a direction substantially normal to said plane, and which abut one of said leads therein;

some ones of said leads extending out of said body to provide a plurality of parallel electromechanical connectors.

2. The device of claim 1, wherein said enclosing body is also extended to provide alignment pins parallel to said connectors.

3. The device of claim 1, wherein some of said through-holes pierce respective ones of said leads.

4. The device of claim 1, wherein some of said through-holes do not abut any of said leads.

5. The device of claim 4 wherein said through-holes which do not abut any of said leads are arranged around the periphery of said control interface device.

6. The device of claim 1, wherein said enclosing body is a single mass of molded epoxy.

7. An electronic motor assembly, comprising:

a housing which encloses a motor and which has an aperture therein with substantially rigid studs protruding through said aperture to provide electrical connection to said motor; and a plurality of leads formed of a common conductive material, and sharing a substantially common plane;

an integrated circuit mounted on at least one of said leads, and electrically connected to others of said leads;

an enclosing body of an electrically insulative material which surrounds said integrated circuit and at least a portion of each said lead;

said body including apertures therein which provide openings into said body in a direction substantially normal to said plane, and which abut one of said leads therein;

some ones of said leads extending out of said body to provide a plurality of parallel electromechanical connectors.

8. The assembly of claim 7, wherein said enclosing body is also extended to provide alignment pins parallel to said connectors.

9. The assembly of claim 7, wherein some of said apertures pierce respective ones of said leads.

10. The assembly of claim 7, wherein some of said apertures do not abut any of said leads.

11. The device of claim 10 wherein said through-holes which do not abut any of said leads are arranged around the periphery of said enclosing body.

12. The assembly of claim 7, wherein said enclosing body is a single mass of molded epoxy.

13. The assembly of claim 7, wherein said apertures are through-hole apertures.

14. A method of assembling an electronic motor assembly, comprising the steps of:

(a) providing a housing which encloses a motor and which has an aperture therein with substantially rigid studs protruding through said aperture to provide electrical connection to said motor;

(b) inserting, onto said studs, a solid control module which includes at least one integrated circuit encapsulated therein, and which has apertures therein in a pattern which generally corresponds to said studs, and including concealed internal electrical connections to at least some of said apertures; said solid control module also having lateral connectors, which are normal to said studs; and (c) inserting a connector, onto said lateral connectors of said solid encapsulated control module, to provide power, signal, and ground connections.

15. The method of claim 13, wherein said apertures are through-hole apertures.

16. The method of claim 14, wherein at least some ones of said apertures are through-hole apertures; and further comprising the subsequent step of attaching one or more discrete components to ones of said studs protruding through said through-hole apertures.

17. The method of claim 14, wherein said enclosing body is also extended to provide alignment pins parallel to said connectors.

18. The method of claim 14, wherein some of said apertures pierce respective ones of said leads.

19. The method of claim 14, wherein some of said apertures do not abut any of said leads.

20. The method of claim 14, wherein said enclosing body is a single mass of molded epoxy.

21. A control interface device for an electronic motor, comprising:

a plurality of leads formed of a common conductive material, and sharing a substantially common plane;

an integrated circuit mounted on at least one of said leads, and electrically connected to others of said leads;

an enclosing body of an electrically insulative material which surrounds said integrated circuit and at least a portion of each said lead;

said body including through-holes therein which pass through said body, in a direction substantially normal to said plane, and which abut one of said leads therein;

wherein said enclosing body is also extended to provide alignment pins parallel to said connectors some ones of said leads extending out of said body to provide a plurality of parallel electromechanical connectors.

* * * * *